(12) United States Patent
Pyykonen

(10) Patent No.: US 7,589,590 B2
(45) Date of Patent: Sep. 15, 2009

(54) CIRCUIT ARCHITECTURE HAVING DIFFERENTIAL PROCESSING FOR USE IN HALF BRIDGES AND FULL BRIDGES AND METHODS THEREFORE

(75) Inventor: Jaakko Pyykonen, Espoo (FI)

(73) Assignee: Nokia Corporation, Espoo (FI)

( * ) Notice: Subject to any disclaimer, the term of this patent is extended or adjusted under 35 U.S.C. 154(b) by 34 days.

(21) Appl. No.: 11/820,648

(22) Filed: Jun. 20, 2007

(65) Prior Publication Data
US 2008/0315948 A1 Dec. 25, 2008

(51) Int. Cl.
H03F 3/217 (2006.01)
H03F 3/38 (2006.01)

(52) U.S. Cl. ............... 330/251; 330/10; 330/207 A
(58) Field of Classification Search ............... 330/10, 330/251, 207 A
See application file for complete search history.

(56) References Cited

U.S. PATENT DOCUMENTS 7,167,046 B2 * 1/2007 Maejima ................ 330/207 A

OTHER PUBLICATIONS

Karstan Nielsen, "Audio Power Amplifier Techniques with Energy Efficient Power Conversion", PhD Thesis, Technical Univ. of Denmark, Lyngby, 1998, http://www.icepower.bang-olufsen.com/sw1065.asp, Chapters 1-3, pp. 1-107.
Jun Honda, Jonathan Adams, "How Class D audio amplifiers work", Audio Design Line, Jan. 23, 2006, pp. 1-9.
Soo-Hyoung Lee et al., "A 2W, 92% Efficiency and 0.01% THD+N Class-D Audio Power Amplifier for Mobile Applications, based on the Novel SCOM Architecture", IEEE Custom Integrated Circuits Conference, 2004, pp. 291-294.
Kathleen Philips, "PowerDAC: A Single-Chip Audio DAC with a 70%-Efficient Power Stage in 0.5 μm CMOS", IEEE International Solid-State Circuits Conference, Feb. 1999, 2 pgs.
Tong Ge et al., "Modeling and Analysis of PSRR in Analog PWM Class D Amplifiers", IEEE International Symposium on Circuits and Systems, 2006, pp. 1386-1389.
Bruno Putzeys, "Simple Self-Oscillating Class D Amplifier with Full Output Filter Control", AES 118th Convention, May 2005, pp. 1-8.
Marco Berkhout, "An Integrated 200-W Class D Audio Amplifier", IEEE Journal of Solid-State Circuits, vol. 38, No. 7 Jul. 2003, pp. 1198-2006.

(Continued)

Primary Examiner—Robert Pascal
Assistant Examiner—Hieu P Nguyen
(74) Attorney, Agent, or Firm—Harrington & Smith, PC

(57) ABSTRACT

Circuit architecture is disclosed that includes one or more half bridges, the one or more half bridges including signal processing circuitry including first and second inputs and one or more outputs. The circuit architecture also includes a driver stage coupled to the one or more outputs of the signal processing circuitry and configured to create at least one output, one of the at least one outputs suitable to couple to a load. The circuit architecture further includes a first feedback loop coupling the at least one output of the driver stage to a first input of the signal processing stage, and includes a second feedback loop coupling the at least one output of the driver stage to a second input of the signal processing stage, where signals on the first and second feedback loops have inverted polarity. Methods and computer-readable media are also disclosed.

29 Claims, 13 Drawing Sheets

OTHER PUBLICATIONS

Tim Piessens, Michiel Steyaert, "Sopa: A High-Efficiency Line Driver in 0.35 μm CMOS using a Self-Oscillating Power Amplifier", IEEE International Solid-State Circuits Conference, Feb. 2001, 4 pgs.

Brett Forejt, "A 700+-mW Class D Design With Direct Battery Hookup in a 90-nm Process", IEEE Journal of Solid-State Circuits, vol. 40, No. 9 Sep. 2005, pp. 1880-1887.

Simon Cimin Li et al., "New High-Efficiency 2.5 V/0.45W RWDM Class-D Audio Amplifier for Portable Consumer Electronics", IEEE Transactions on Circuits and Systems 1, vol. 52, No. 9, Sep. 2005, pp. 1767-1774.

Ronnie Bean et al., "An Integrated 40W Analog Input Class D Amplifier With Improved Clipping Recovery and Reduced Turn-On Transients", AES 27th International Conference, Sep. 2005, pp. 1-8.

* cited by examiner

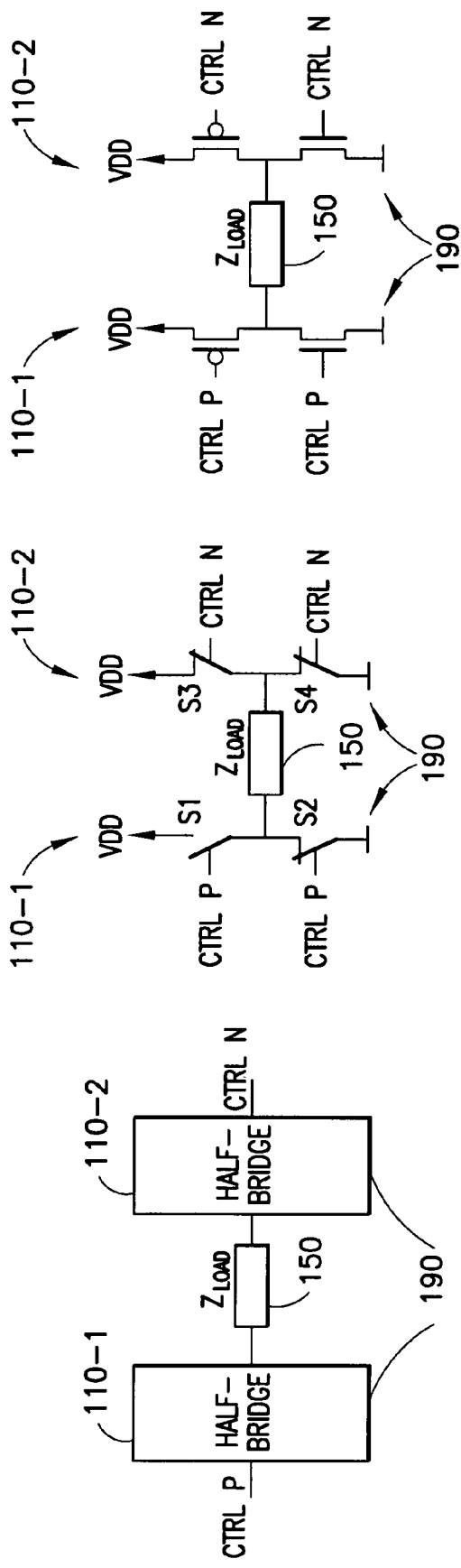

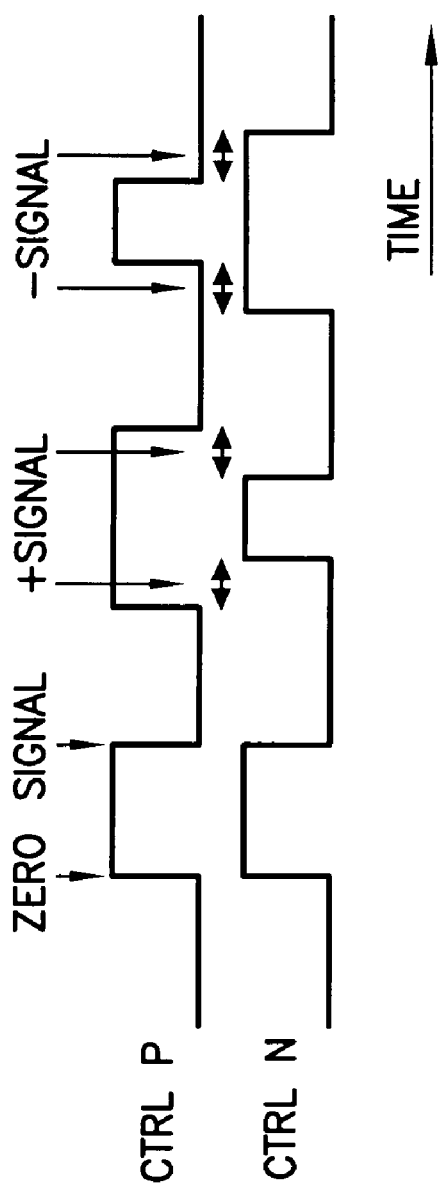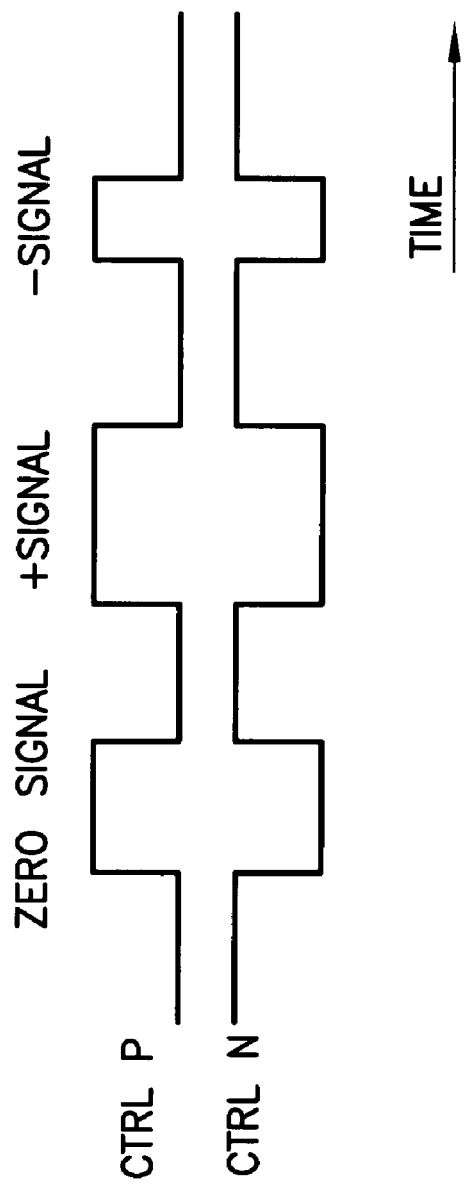

CIRCUIT ARCHITECTURE HAVING DIFFERENTIAL PROCESSING FOR USE IN HALF BRIDGES AND FULL BRIDGES AND METHODS THEREFORE

TECHNICAL FIELD

This invention relates generally to differential circuit architecture and, more specifically, relates to differential circuit architecture using one or more half bridges.

BACKGROUND

Amplifiers are necessary in order to create a higher power signal from a lower power signal. A common application of an amplifier is to take an audio signal such as a voice or music signal and to amplify the signal to a power suitable to drive one or more speakers. For instance, many audio systems take information from sources such as compact disks, create a low power audio signal from the information, and amplify the information for presentation on speakers. Similarly, mobile devices such as cellular phones also take voice, music, or movie audio information and amplify the audio information for presentation on an internal or external speaker.

Amplifiers are typically grouped into "classes". For instance, class-A, class-B, and class-AB amplifiers have been used for quite some time. These classes are met by analog amplifiers. One detriment to these types of amplifiers is a relatively low efficiency. For example, class-A amplifiers have a maximum theoretical efficiency of only 50 percent, while class-B amplifiers have a maximum theoretical efficiency of around 78 percent. These efficiencies can be suitable for certain audio systems, such as used in a home, but are typically too inefficient for use in portable systems, where battery life is important.

A relatively recent addition to amplifier classes is the so-called "class-D" amplifiers, which are switching amplifiers. Class-D amplifiers have become popular because their theoretical power efficiency is 100 percent and practically they can reach over 90 percent efficiency. Such amplifiers are therefore more suitable to portable systems, although they are not limited to such systems. In fact, many home theater amplifiers are made from class-D amplifiers.

While class-D amplifiers have benefits including high efficiencies, these amplifiers could still be improved.

BRIEF SUMMARY

In an exemplary embodiment, circuit architecture is disclosed that includes one or more half bridges, the one or more half bridges including signal processing circuitry including first and second inputs and one or more outputs. The circuit architecture also includes a driver stage coupled to the one or more outputs of the signal processing circuitry and configured to create at least one output, one of the at least one outputs suitable to couple to a load. The circuit architecture further includes a first feedback loop coupling the at least one output of the driver stage to a first input of the signal processing stage, and includes a second feedback loop coupling the at least one output of the driver stage to a second input of the signal processing stage, where signals on the first and second feedback loops have inverted polarity.

In another exemplary embodiment, circuit architecture includes one or more half bridges, including means for signal processing including first and second inputs and one or more outputs and means for amplifying coupled to the one or more outputs of the means for signal processing. The means for amplifying creates one or more outputs, one of the one or more outputs suitable for coupling to a load. The circuit architecture includes a first feedback means for coupling the one or more outputs of the means for amplifying to a first input of the means for signal processing. The circuit architecture also includes a second feedback means for coupling the one or more outputs of the means for amplifying to a second input of the means for signal processing, where signals on the first and second feedback means have inverted polarity.

In a further exemplary embodiment, an electronic device is disclosed that includes circuit architecture including one or more half bridges, including signal processing circuitry. The signal processing circuitry includes first and second inputs and one or more outputs. The signal processing circuitry also includes a driver stage coupled to the one or more outputs of the signal processing circuitry and configured to create one or more outputs, one of the one or more outputs suitable to couple to a load. The one or more half bridges further include a first feedback loop coupling the one or more outputs of the driver stage to a first input of the signal processing stage, and include a second feedback loop coupling the one or more outputs of the driver stage to a second input of the signal processing stage, where signals on the first and second feedback loops have inverted polarity.

In yet another exemplary embodiment, an audio system is disclosed that includes one or more amplifiers that include one or more half bridges. The one or more half bridges include signal processing circuitry including first and second inputs and one or more outputs. The first and second inputs are configured to be coupled to an audio signal. The one or more half bridges also include a driver stage coupled to the one or more outputs of the signal processing circuitry and configured to create one or more outputs, one of the one or more outputs suitable to couple to a load. The one or more half bridges also include a first feedback loop coupling the one or more outputs of the driver stage to a first input of the signal processing stage. The one or more half bridges further include a second feedback loop coupling the at least one output of the driver stage to a second input of the signal processing stage, where signals on the first and second feedback loops have inverted polarity. The one or more amplifiers include modulation circuitry coupled to the signal processing circuitry and configured to provide a modulation waveform to the signal processing circuitry and include one or more connection suitable to couple the output of the driver stage to a load.

In an additional exemplary embodiment, a method is disclosed that includes processing a first input signal on a first input and a second input signal on a second input to create at least one processed output signal. The method also includes amplifying the at least one processed output signal to create at least one amplified output signal, one of the at least one amplified output signals suitable to couple to a load. The method further includes feeding back to one of first and second inputs a first feedback signal that is a first version of the at least one amplified output signal. The method includes feeding back to the other of the first and second inputs a second feedback signal that is a second version of the at least one amplified output signal, where the first and second feedback signals have inverted polarity.

BRIEF DESCRIPTION OF THE DRAWINGS

The foregoing and other aspects of embodiments of this invention are made more evident in the following Detailed Description of Exemplary Embodiments, when read in conjunction with the attached Drawing Figures, wherein:

FIG. 1, which includes FIGS. 1A, 1B, and 1C, diagrams three simple class-D amplifiers.

FIG. 2, which includes FIGS. 2A and 2B, graphs class-BD pulse width modulated (PWM) signalization of a full bridge amplifier (FIG. 2A), and class-AD PWM signalization of a full bridge amplifier (FIG. 2B).

FIG. 7, including

DETAILED DESCRIPTION OF EXEMPLARY EMBODIMENTS

Figure 3:
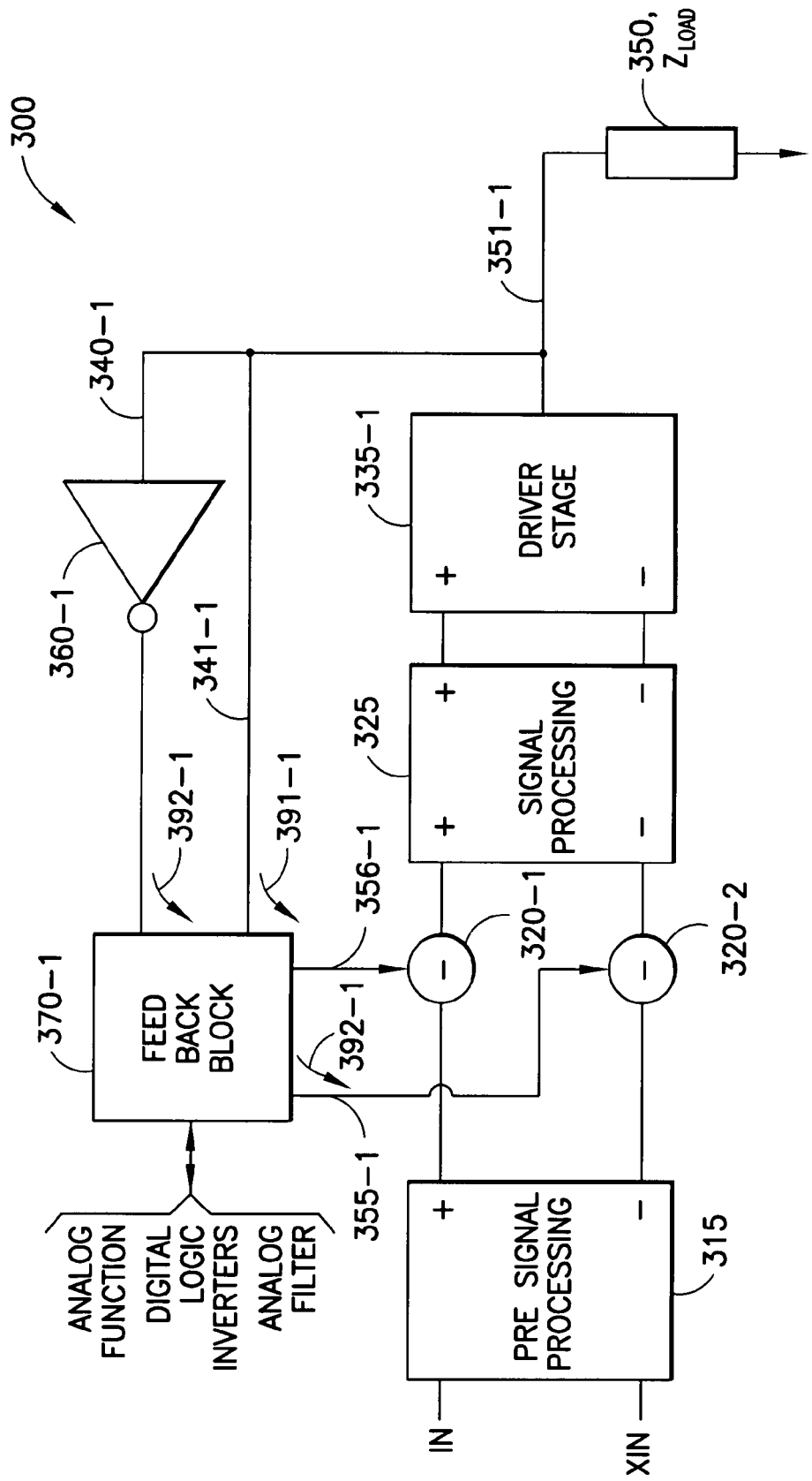
FIG. 3 is a diagram of a half bridge class-D amplifier connected to a load in accordance with an exemplary embodiment.

Prior to proceeding with a description of exemplary embodiments of differential circuit architecture suitable for use in class-D amplifiers, an introduction to class-D amplifiers will now be given.

Turning now to FIG. 1, which includes FIGS. 1A, 1B, and 1C, diagrams are shown of three simple class-D amplifiers. FIG. 1A shows a full bridge class-D amplifier 190 that is coupled to a load 150 having an impedance of $Z_{load}$. The class-D amplifier 190 includes two half bridge amplifiers 110-1 and 110-2. In FIG. 1, the input signal (CNTL N, CNTL P) is usually an analog signal having values between VDD and ground. At its simplest, a half bridge class-D amplifier 110 is two switches, as shown in FIG. 1B. Thus, FIG. 1B shows the simplest implementation of the half-bridge amplifiers 110 by the switches S1-S4. The output from each of the half bridge amplifiers 110 has two possible voltage values: ground (0) and supply voltage (VDD). The output power can be maximized when the load 150 is driven by two class-D amplifiers as shown in FIG. 1. It is noted that the voltage across the load 150 varies from +VDD to −VDD. FIG. 1C shows the switches S1 through S4 implemented using NMOS (N-type Metal Oxide Semiconductor transistor) and PMOS (P-type Metal Oxide Semiconductor transistor) switches.

Referring to FIG. 2, which includes FIGS. 2A and 2B, graphs of class-BD pulse width modulated (PWM) signalization of a full bridge (FIG. 2A), and class-AD PWM signalization of a full bridge (FIG. 2B). The maximum power-efficiency is achieved when there is current over the load only as a function of the output signal. This is achieved by a class-BD signalization, for example, as described in FIG. 2A. In the signalization example of FIG. 2B (class-AD), there is a maximum current over the load all the time.

Drawbacks of class-D amplifiers include sensitivity to power supply ripple, because some class-D amplifiers have low power supply rejection ratios (PSRRs), and include non-linearity of the output signal. However, the PSRR and the linearity can be improved by feedback and signal pre-processing. Nonetheless, the class-BD signalization of the typical full bridge is not differential as seen in FIG. 2A. Therefore, the signal processing prior to a driver stage of the full bridge does not implement differential processing in this example, and the signal processing circuitry prior to the driver stage of the half-bridges are single-ended.

Furthermore, the signals of typical two half bridges are usually processed separately and, therefore, the circuits related to the half bridge class-D amplifiers are single-ended circuits. The single-ended circuits are more sensitive to ripple and noise that is coupled by the circuits than are differential circuits.

The single ended circuits require a signal ground, which is a reference for signals used in the circuits and also output from the circuits. Therefore, the requirements, such as noise, to the generation of the signal ground are as demanding as are the requirements for the signal. Therefore, the single-ended circuitry in the half bridges could be improved. Furthermore, in the case where the signal processing is combined with the two half-bridges, differential signal processing is used, but the feedback for signal processing is a class-BD and thus not differential.

Now that an introduction has been given, exemplary embodiments of the disclosed invention will now be described. In order to improve single-ended circuitry used in half bridges for class-D amplifiers, in an exemplary embodiment herein a circuit branch is added to the pre-processing of the half bridges in order to perform the analog signal processing in differential form. The present disclosure is divided into two broad sections: FIGS. 3 and 7-10 describe signal processing in two independent half bridges, while FIGS. 4-6 describe combined signal processing in a full bridge.

A block diagram of an exemplary embodiment of the disclosed invention is shown in FIG. 3. In FIG. 3, the inputs IN and XIN form a differential analog input signal or, if the input signal is digital, the XIN is inverted from the IN as in the class-AD signalization in FIG. 2B. The half bridge 300 includes (e.g., optional) pre-processing circuitry 315, adders 320-1 and 320-2, signal processing circuitry 325, a driver stage 335-1, which produces an output 351-1 suitable for coupling to load 350 (having an impedance of $Z_{LOAD}$), a feedback block 370-1, an inverter 360-1, and feedback signals 340-1, 341-1, 355-1, and 356-1. The optional pre-signal processing circuitry 315 is circuitry that in an exemplary embodiment converts the analog or digital information at the input to a form that is suitable for combination with the feedback signal(s). The feedback signal 355-1 is routed to the adder 320-2. The feedback block 370-1 is fully differential in this example and has inputs of the feedback signals 340-1, 340-2 and outputs of the feedback signals 355-1, 356-1. There are two feedback loops 391-1 and 392-1, each of which has an opposite polarity. In other words, a signal on the feedback loop 391-1 has polarity opposite the polarity of a signal on the feedback loop 392-1. The "+" (plus sign) indicates a non-inverted input/output, and the "−" (minus sign) indicates an inverted input/output.

The driver stage 335-1 can include a "pre-buffering" stage, which has more driving capability to drive a load at the input of the next stage (e.g., a power driver stage). The driver stage 335-1 is in an exemplary embodiment capable of driving a signal at a particular (e.g., high) power level to a low-ohmic load such as load 350. Feedback block 370-1 can include, for instance, wires or two inverters (e.g., one in each feedback loop) in order to cause a delay. Additionally, digital logic (e.g., other than inverters) may also be used. The feedback block 370-1 can also be an analog filter or any analog function or digital function (e.g., as defined by digital logic). It is noted that an analog filter is shown in FIG. 7. Illustratively, the signal processing circuitry 325 can include an integrator, include a comparator, and include or be coupled to a triangle wave generator, among other circuitry. It is noted that the "adders" 320 could simply be wire connections (e.g., runs on a printed circuit board or integrated circuit).

Figure 4:
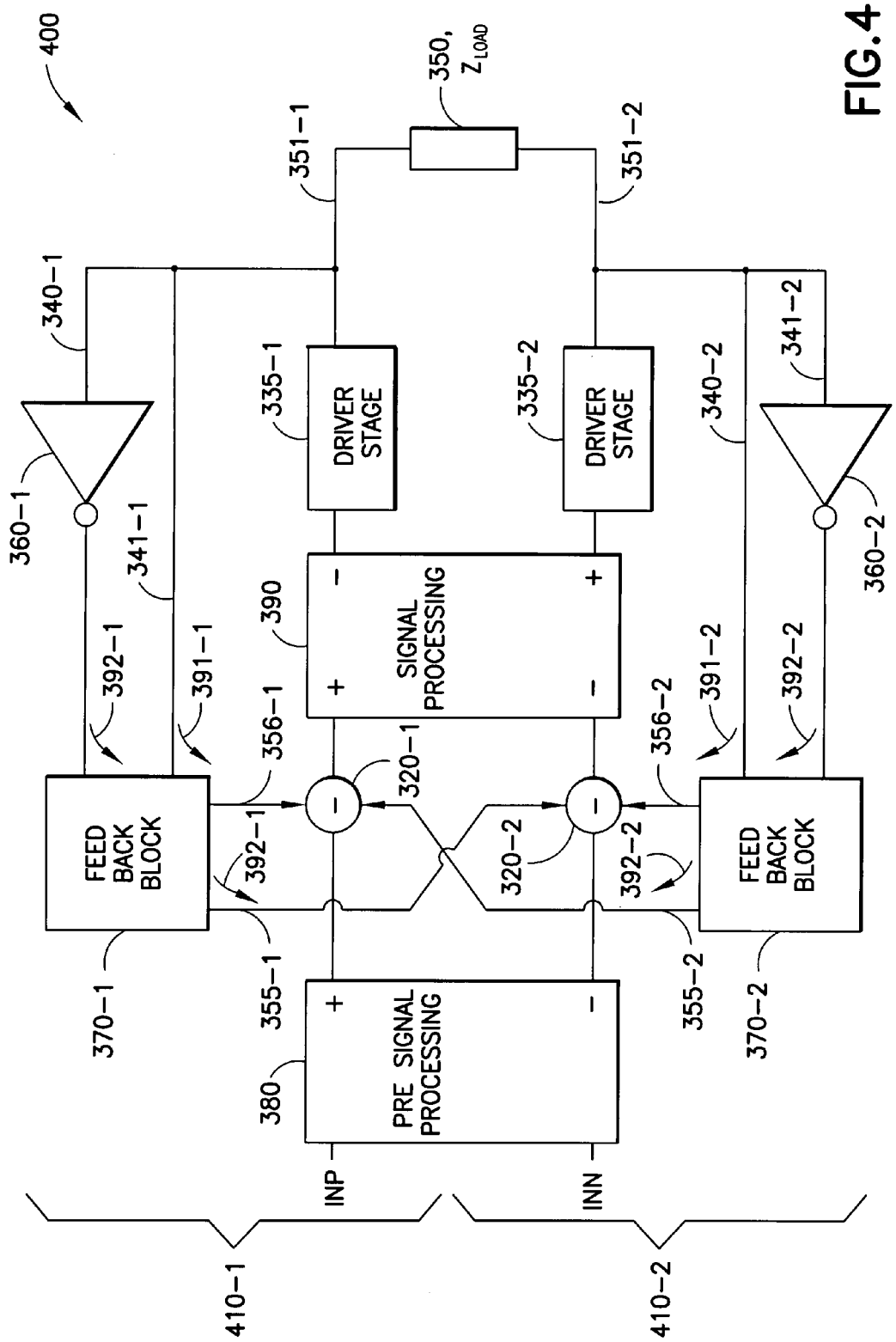
FIG. 4, is a diagram of a full bridge class-D amplifier connected to a load, where the full bridge is created using elements of the half bridge shown in FIG. 3, in accordance with an exemplary embodiment.

Turning to FIG. 4 in addition to previous figures, FIG. 4 is a diagram of a full bridge class-D amplifier 400 connected to a load 350. The full bridge 400 is created using elements of the half bridge 300 shown in FIG. 3, in accordance with an exemplary embodiment. This example of the disclosed invention adds feedback paths to the system in order to form class AD-signals from the two class-BD outputs to the differential feedback summing nodes (e.g., adders 320-1 and 320-2 in this example).

The full bridge 400 includes (e.g., optional) differential pre-processing circuitry 380, adders 320-1 and 320-2, differential signal processing circuitry 390, driver stages 335-1 and 335-2, which produce outputs 351-1 and 351-2 respectively suitable for coupling to load 350, inverters 360-1 and 360-2, feedback blocks 370-1 and 370-2, and feedback signals 340-1, 340-2, 341-1, 341-2, 355-1, 355-2, 356-1, and 356-2. In this example, feedback signal 355-1 gets routed to the adder 320-2, while the feedback signal 355-2 gets routed to the adder 320-1. There are four feedback loops, 391-1, 391-2, 392-1, and 392-2. Feedback loops 391-1 and 392-1 have opposite polarity, as do the feedback loops 391-2 and 392-2.

The full bridge 400 includes two half bridges 410-1 and 410-2, each of which includes most of the elements of the half bridge 300. The pre-signal processing circuitry 380 and signal processing circuitry 390 are shared by the half bridges 410.

Figure 5:
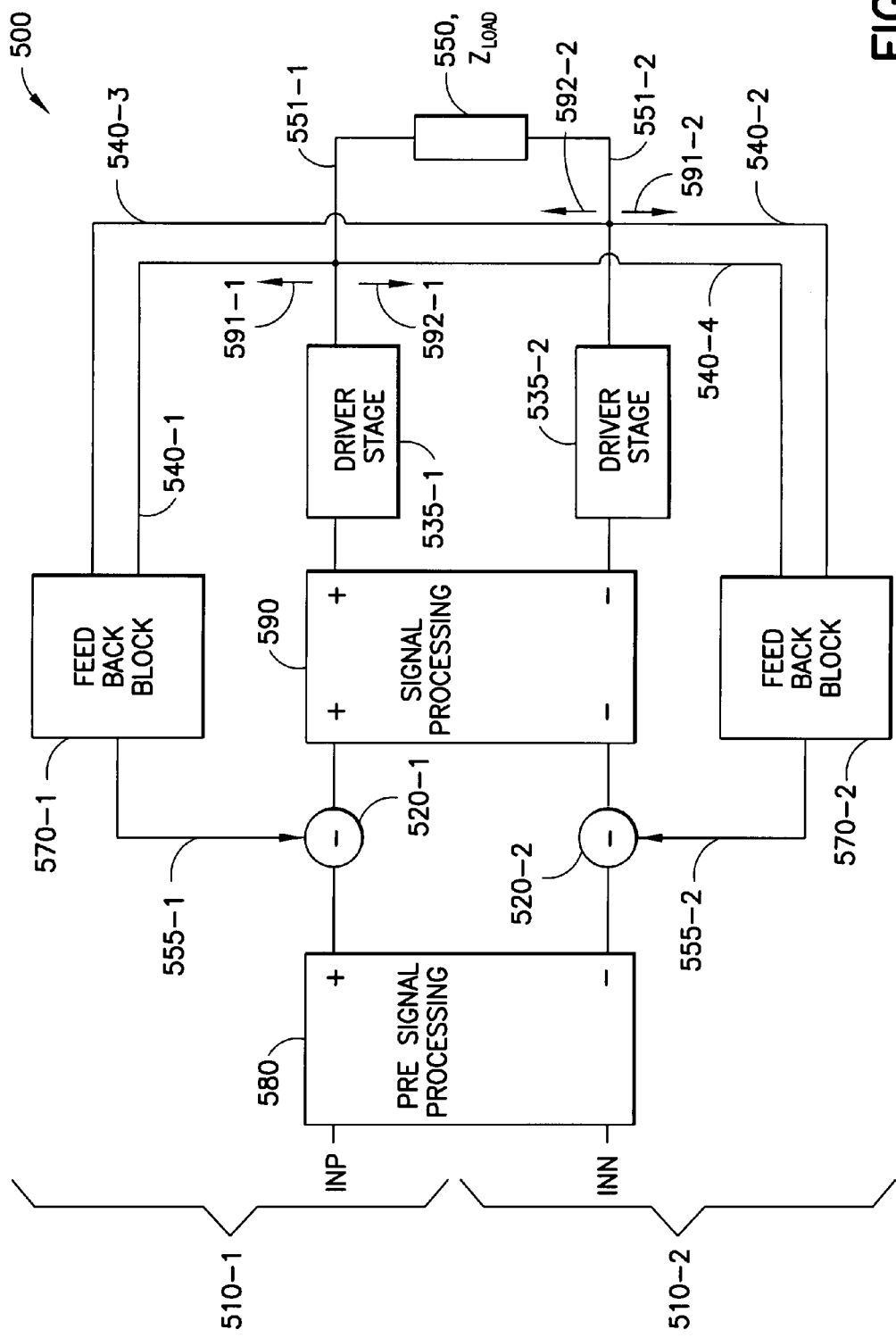
FIG. 5 is a diagram of a full bridge class-D amplifier connected to a load in accordance with an exemplary embodiment herein.

Referring to FIG. 5 and previous figures where necessary, a diagram is shown of a full bridge class-D amplifier 500 connected to a load 550 in accordance with an exemplary embodiment herein. The full bridge 500 includes (e.g., optional) differential pre-processing circuitry 580, adders 520-1 and 520-2, differential signal processing circuitry 590, driver stages 535-1 and 535-2, which produce outputs 551-1 and 551-2 respectively suitable for coupling to load 550, feedback blocks 570-1 and 570-2, and feedback signals 540-1 through 540-4, 551-1, and 555-2. In this example, feedback signals 555-1 and 555-2 are not routed through inverters and are also not "crossed" in that feedback signal 555-1 is routed to the adder 520-1, while the feedback signal 555-2 is routed to the adder 520-2. In FIG. 5, there are four feedback loops, 591-1, 591-2, 592-1, and 592-2. Feedback loops 591-1 and 592-2 have opposite polarity, as do the feedback loops 592-1 and 591-2. The full bridge 500 includes two half bridges 510-1 and 510-2. The pre-signal processing circuitry 580 and signal processing circuitry 590 are shared by the half bridges 510.

Figure 6:
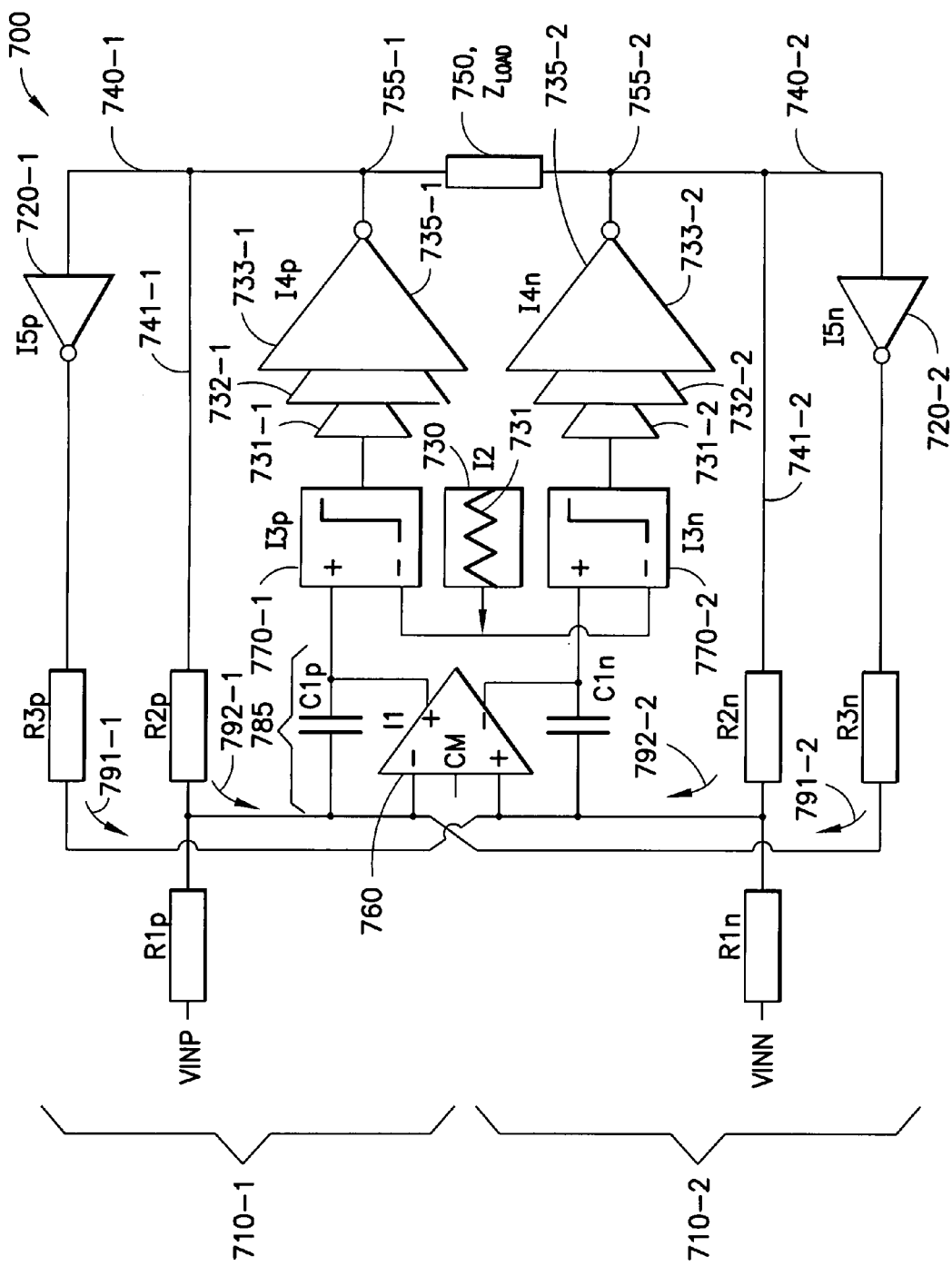
FIG. 6 is a diagram of a full bridge class-D amplifier connected to a load in accordance with an exemplary embodiment herein.

FIG. 6 is a diagram of a full bridge class-D amplifier 700 connected to a load 750 in accordance with an exemplary embodiment herein. The full bridge class-D amplifier 700 is an implementation of the full bridge class-D amplifier 400 shown in FIG. 4. The full bridge 700 includes resistors R1$p$, R2$p$, R3$p$, R1$n$, R2$n$, and R3$n$, capacitors C1$p$ and C1$n$, an operational amplifier 760, comparators 770-1 and 770-2, driver stages 735-1 (including cascaded inverters 731-1, 732-1, and 733-1) and 735-2 (including cascaded inverters 731-2, 732-2, and 733-2) that produce outputs 755-1 and 755-2 respectively, which are suitable for coupling to load 750, feedback signals 740-1, 740-2, 741-1, and 742-2, inverters 720-1 and 720-2, and modulating circuit 730. It is noted that the modulating circuit 730 produces a modulating waveform 731, which in this case is a triangular waveform. The capacitors C1$p$ and C1$n$ and the operational amplifier 760 form an integrator 785. There are four feedback loops 791-1, 791-2, 792-1, and 792-2. The polarity of the feedback loop 791-1 is opposite the polarity of the feedback loop 792-1, and the polarity of the feedback loop 791-2 is opposite the polarity of the feedback loop 792-2. The full bridge 700 includes two half bridges 710-1 and 710-2. The signal processing circuitry (e.g., the integrator 785 and comparators 770) is shared by the half bridges 710. The pre-processing circuitry includes resistors R1$p$ and R1$n$, which are not shared by the half bridges 710.

In order to minimize the noise of the feedback resistors (e.g., R2$p$, R3$p$, R2$n$, and R3$n$), the feedback resistors, which are connected to one of the inputs of the operational amplifier, could be combined and the feedback signal could be created from the two outputs by logic gates. FIG. 6 can be modified to many other implementations using voltage mode or current mode signal processing or digital signal processing to form class AD feedback paths from the class BD signals.

It should be noted that the figures herein and FIG. 6 in particular are merely exemplary and every possible implementation detail has not been shown. For instance, if the input signal (VINP, VINN) is an audio signal and the full bridge class-D amplifier 700 is used in certain audio systems such that the load 750 is a speaker, there could be a low pass filter installed between the outputs of the driver stages 735 and the load 750, as is known in the art.

Figures 7A, 7B:
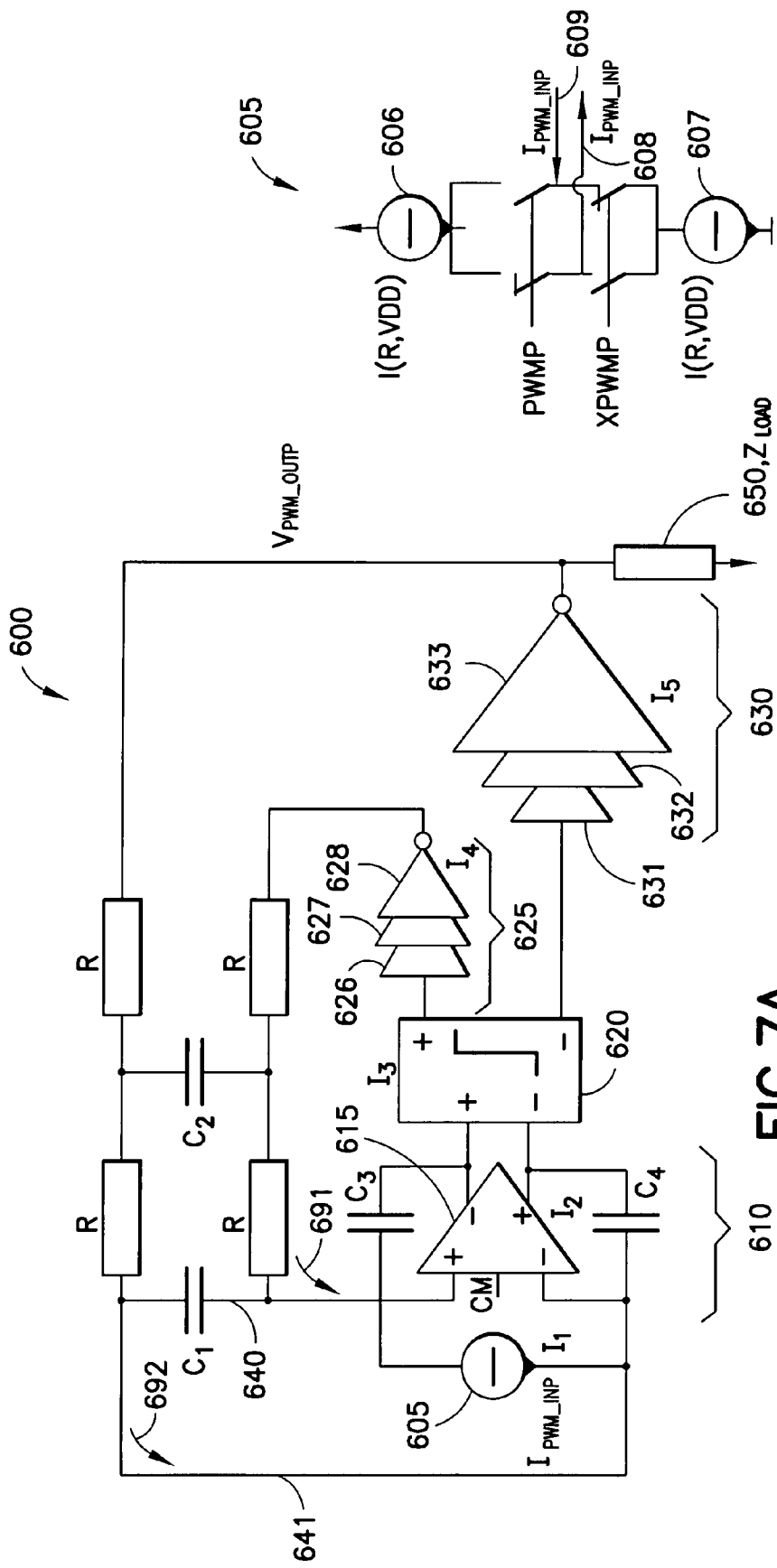
FIGS. 7A and 7B, is a diagram of a half bridge class-D amplifier, having differential circuitry, connected to a load in accordance with an exemplary embodiment herein.

Turning now to FIG. 7 (and previous figures), which includes FIGS. 7A and 7B, this figure shows diagram of a half bridge class-D amplifier 600 connected to a load 650 in accordance with an exemplary embodiment herein. In particular, FIG. 7 shows an example of a differential half bridge 600. In FIG. 7, I1 605 is a differential current mode input signal (usually a pulse width modulated signal) and, e.g., is part of the pre-signal processing circuitry 315 in FIG. 3. I1 605 is therefore a PWM-input-signal-controlled differential current source. The signal PWMP is the signal IN in FIG. 3, and the signal XPWMP is the signal XIN in FIG. 3. Element 606, I(R,VDD), is a current source that has a value dependent on the VDD and a resistor (e.g., material having the same variation as the other resistors, R). Element 607 is a current sink with similar properties to the element 606. The signal $I_{PWM\_INP}$ is a differential output of the differential current source 605. The bottom signal $I_{PWM\_INP}$ 608 is coupled to the (+) input of operational amplifier 615, while the top signal $I_{PWM\_INP}$ 609 is coupled to the (−) input of operation amplifier 615. The "CM" is a common mode input. I2 is an operational amplifier 615 that forms the basis of a differential integration stage 610 and I3 is a comparator 620. There are two feedback loops 691 and 692, which have opposite polarity.

In an exemplary embodiment, the differential integration stage 610 and the comparator 620 are part of the signal processing circuitry 325 as in FIG. 3. The operational amplifier 615 still requires a reference signal ground but this ground is much less critical than is the signal ground in single-ended signal processing. I4 625 includes three sequential inverters 626, 627, and 628 in this example, and I5 630 includes three sequential inverters 631, 632, and 633, where the outmost inverter 633 is capable, e.g., of driving a small load impedance of few Ohms. I4 625 and I5 630 are part of the driver stage 335-1, and I4 625 can be considered a "pre-buffering" stage, while I5 630 can be considered a power driver stage, as discussed above. $C_1$-$C_4$ are capacitors, and the R-components are resistors. The capacitors $C_3$ and $C_4$ are part of the differential integration stage 610. The capacitors $C_1$ and $C_2$ and the resistors form a feedback block (e.g., feedback block 370-1 of FIG. 3) and form differential feedback (e.g., including feedback signals 640, 641, corresponding to feedback signals 356-1 and 355-1, respectively). In this example, there is no inverter 360-1. Also, the adders 320 from FIG. 3 are in the example of FIG. 7 are simply wire connections (e.g., runs on a printed wiring board or on an integrated circuit).

Figure 8:
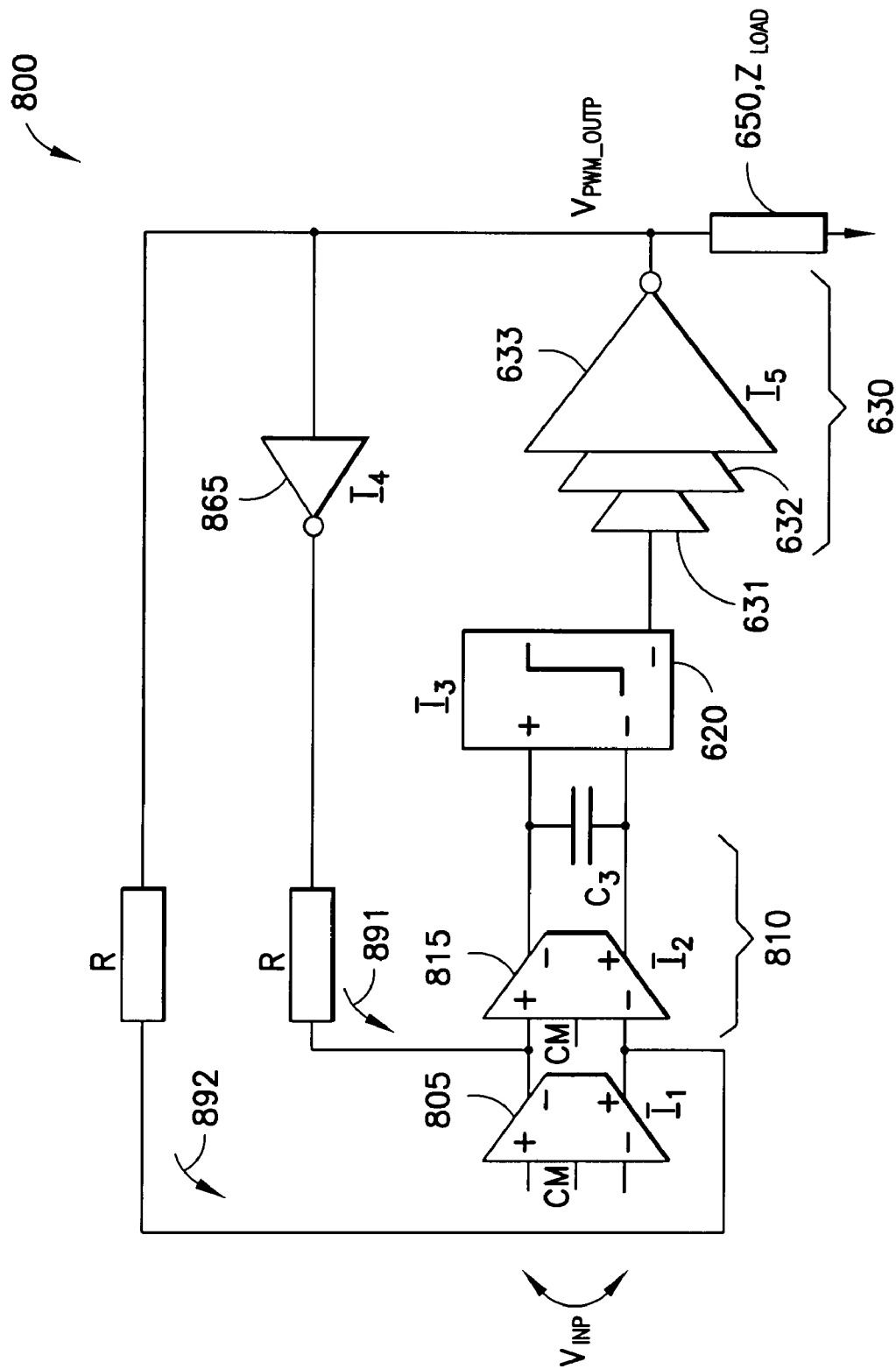
FIG. 8 is a diagram of a half bridge class-D amplifier connected to a load in accordance with an exemplary embodiment herein.

FIG. 8 is a diagram of a half bridge class-D amplifier 800 connected to a load 650, in accordance with an exemplary embodiment herein. The amplifier 800 has several independent modifications from the circuit topology of FIG. 7. The modifications (relative to the amplifier 600 of FIG. 7) in FIG. 8 are as follows. There is little or no theoretical need for filtering in the feedback. Thus, the capacitors $C_1$ and $C_2$ can be removed and the series resistors can then be combined. If the input signal is an analog signal voltage, I1 605 can be a $g_m$-element 805, e.g., a transconductance amplifier, which is a linear voltage-to-current converter, $g_m = d(i_{out})/d(v_{in})$, where $d(\cdot)$ means "derivative". The operational amplifier 615 in the integration stage 610 can be a $g_m$-element 815 as well, and the integrator-capacitors $C_3$ and $C_4$ can be replaced by a capacitor $C_3$ between the differential outputs of the $g_m$-element 815. An integration stage 810 therefore includes the $g_m$-element 815 and the capacitor $C_3$. The comparator output and the pre-driver stages, in FIG. 7, are not truly differential, meaning that the supply ripple might add to the differential outputs. Therefore, the comparator and the pre-driver stages can be single-ended and the differential branch for the feedback is created by one inverter, I4 865 in FIG. 8, instead of three inverters 625. There are two opposite-polarity feedback loops 891, 892.

Figure 9:
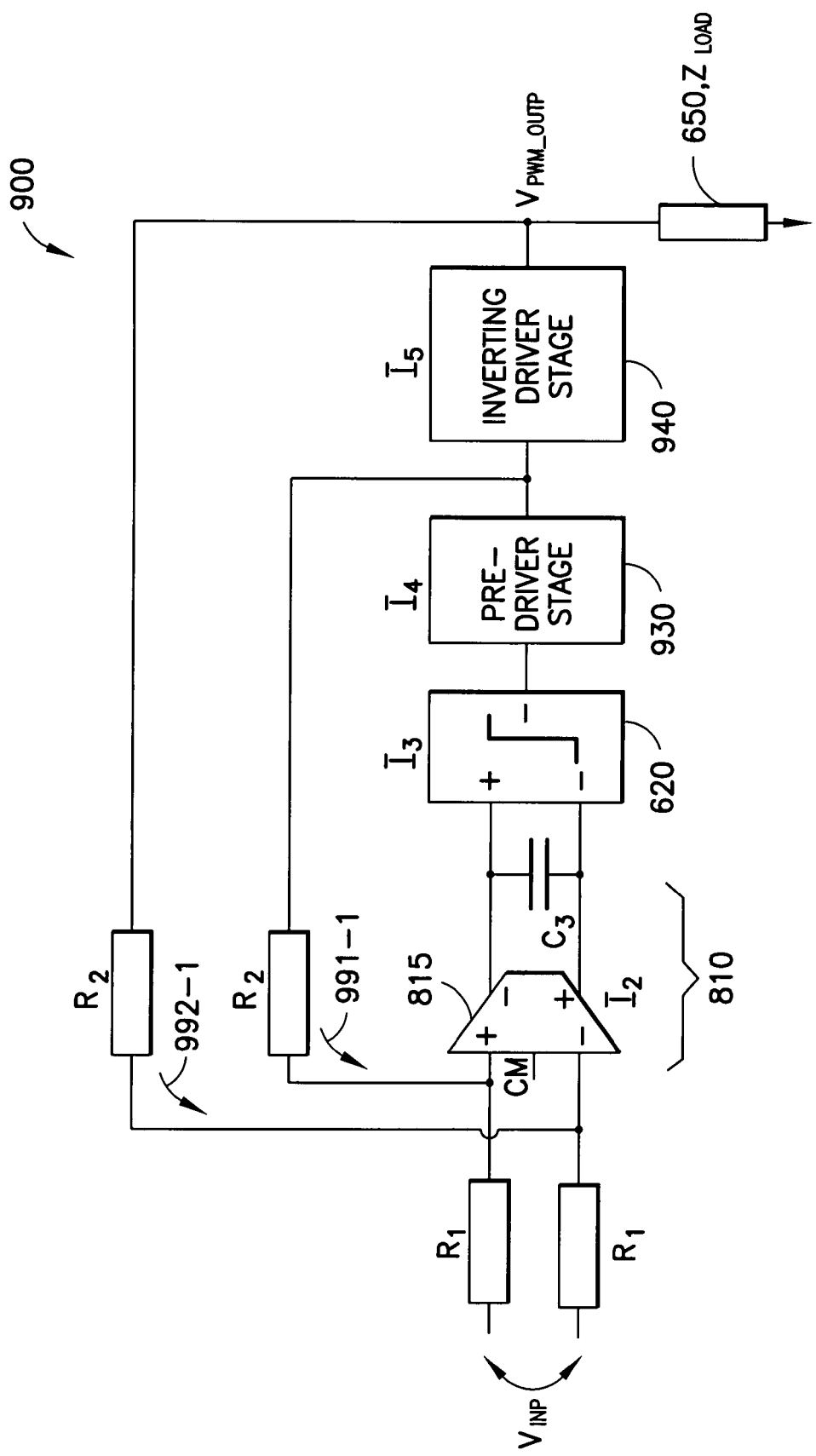
FIG. 9 is a diagram of a half bridge class-D amplifier connected to a load in accordance with an exemplary embodiment herein.

FIG. 9 is a diagram of a half bridge class-D amplifier 900 connected to a load 650, in accordance with an exemplary embodiment herein. FIG. 9 shows another implementation example where there are two independent modifications relative to the amplifier 800 of FIG. 8. When the input is an analog signal, the input can be fed to the virtual ground, i.e., to the input of the active element of I2 815 via resistors R1. The pre-driver stage 930 and the driver stage 940 can be implemented with many different circuits. Feedback is also taken in this example from the output of the pre-driver stage 930. There are two opposite-polarity feedback loops 991-1, 992-2.

Figure 10:
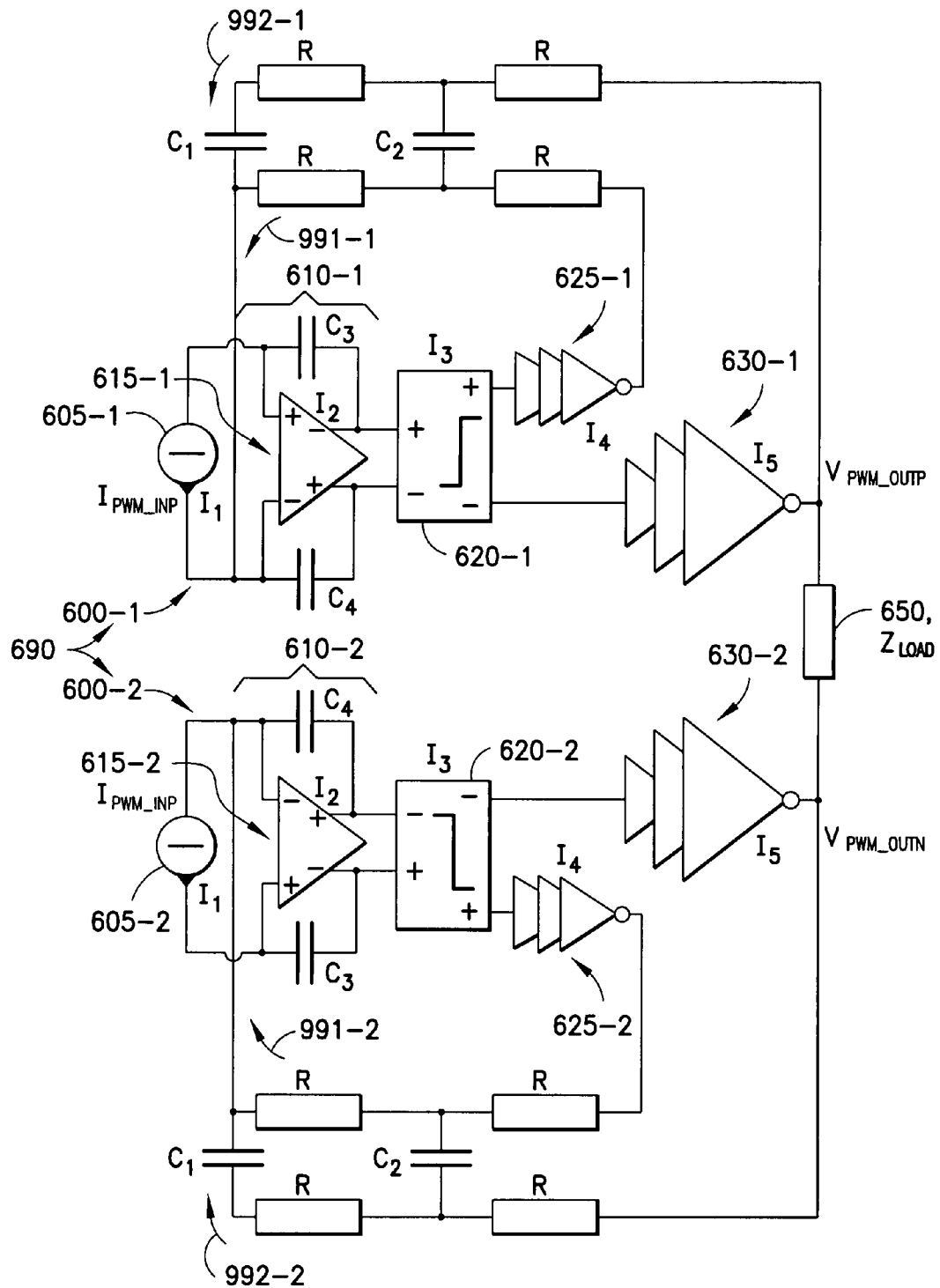
FIG. 10 is a diagram of a full bridge class-D amplifier connected to a load in accordance with an exemplary embodiment herein, wherein the full bridge class-D amplifier includes two half bridges shown in FIG. 7.

FIG. 10 is a diagram of a full bridge class-D amplifier connected to a load in accordance with an exemplary embodiment herein, wherein the full bridge class-D amplifier 690 includes two half bridges 600-1 and 600-2. A single one (e.g., 600-1) of these half bridges is shown in FIG. 7. There are two opposite-polarity feedback loops 991-1, 992-2 and an additional two opposite-polarity feedback loops 991-2, 992-2.

The full bridge and half bridge class-D amplifiers have a variety of applications. Illustratively, these amplifiers can be used in audio power-amplifiers in any audio system, which produce audio sound, in low-frequency power-amplification, in DC/DC regulators, in data-modem line-drivers, in RF (radio frequency) power-amplifiers, or in electrical motor controllers.

Figure 11:
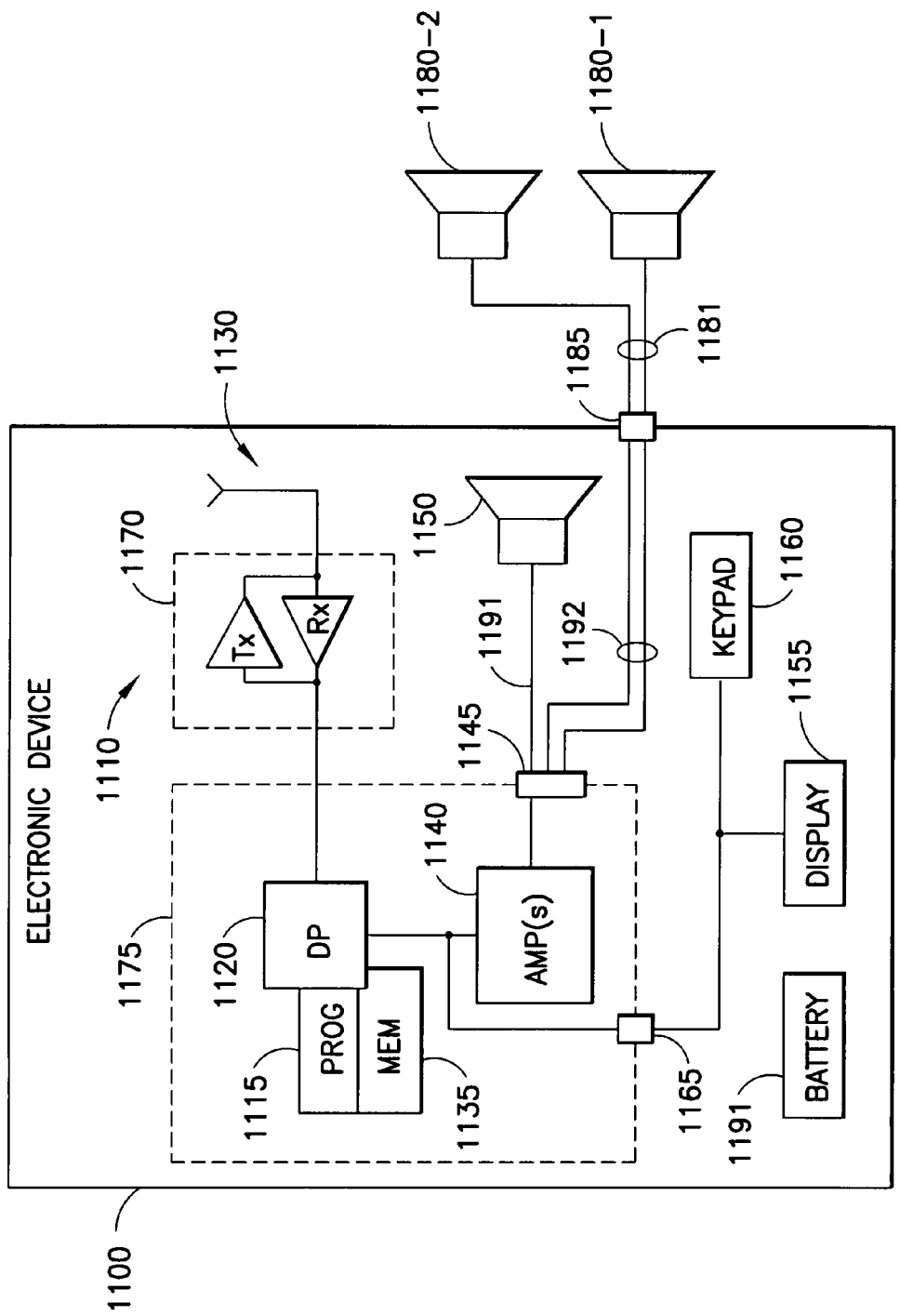
FIG. 11 is a simplified block diagram of an electronic device that uses a half or full bridge amplifier from any of the previous figures.

One exemplary application for class-D amplifiers is in battery powered devices, such as the electronic device 1100. FIG. 11 is a simplified block diagram of a electronic device 1100 that uses a half or full bridge class-D amplifier, as amplifier (Amp) 1140 from FIGS. 3-10. The electronic device 1100 comprises two integrated circuits 1175, 1170 (e.g., placed on one or more printed wiring boards, not shown), an antenna 1130, a speaker 1150, a keypad 1160, a display 1155, and an audio connector 1185. The integrated circuit 1175 includes a data processor (DP) 1120, a memory (MEM) 1135, one or more full or half bridge class-D amplifiers (AMP(s)) 1140 as shown previously, and connectors 1145 and 1165. The electronic device 1100 has a battery 1191, from which the electronic device 1100 is powered. The memory 1135 includes a program (PROG) 1115 that produces in an exemplary embodiment audio data for presentation on speaker 1150 (or speaker(s) 1180).

In this exemplary embodiment, the electronic device 1100 has a monaural coupling (e.g., a wire, a trace on a printed wiring board) 1191 and a stereo coupling (e.g., wires, traces on a printed wiring board) 1192. The electronic device 1100 is coupled through audio connector 1185 and interconnects 1181 to stereo speakers 1180-1 and 1180-2, which could be headphones as an example. The connector 1185 could also be coupled to another amplifier (not shown), for driving larger speakers 1180.

It is noted that exemplary embodiments of the disclosed invention may be implemented in a data processor. As such, the amplifier 1140 may be formed as part of data processor 1120, and the PROG 1115 may contain instructions suitable for execution on the data processor in order to perform operations described herein. Furthermore, exemplary embodiments may be implemented on a computer-readable medium including program instructions tangibly embodied thereon, execution of the program instructions resulting in operations described herein. The computer-readable medium could include a memory (e.g., MEM 1135), a compact disk (CD), a digital versatile disk (DVD), other optical memory storage, a hard drive, a memory stick, or other magnetic memory storage. For instance, in an exemplary embodiment, a computer-readable medium is disclosed that includes program instructions tangibly embodied thereon, execution of the program instructions resulting in operations including: processing a first input signal on a first input and a second input signal on a second input to create at least one processed output signal; amplifying the at least one processed output signal to create at least one amplified output signal, one of the at least one amplified output signals suitable to couple to a load; feeding back to one of first and second inputs a first feedback signal that is a first version of the at least one amplified output signal; and feeding back to the other of the first and second inputs a second feedback signal that is a second version of the at least one amplified output signal, where the first and second feedback signals have inverted polarity.

In general, the various embodiments of the electronic device 1100 can include, but are not limited to, cellular telephones, personal digital assistants (PDAs), portable computers, image capture devices such as digital cameras, gaming devices, music storage and playback appliances, Internet appliances permitting wireless Internet access and browsing, as well as portable units or terminals that incorporate combinations of such functions. The electronic device 1100 may or may not be coupled to wired or wireless networks. The electronic device 1100 is only one example of an implementation that uses the exemplary embodiments herein. Other implementations could be, as non-limiting examples, class-D amplifiers used in home or professional audio equipment, in low-frequency power-amplification, in DC/DC regulators, in data-modem line-drivers, in RF power-amplifiers, or in electrical motor controllers. It is noted that FIG. 11 is not to be limiting, as exemplary embodiments herein may be used in battery-powered or non-battery powered devices.

Figure 12:
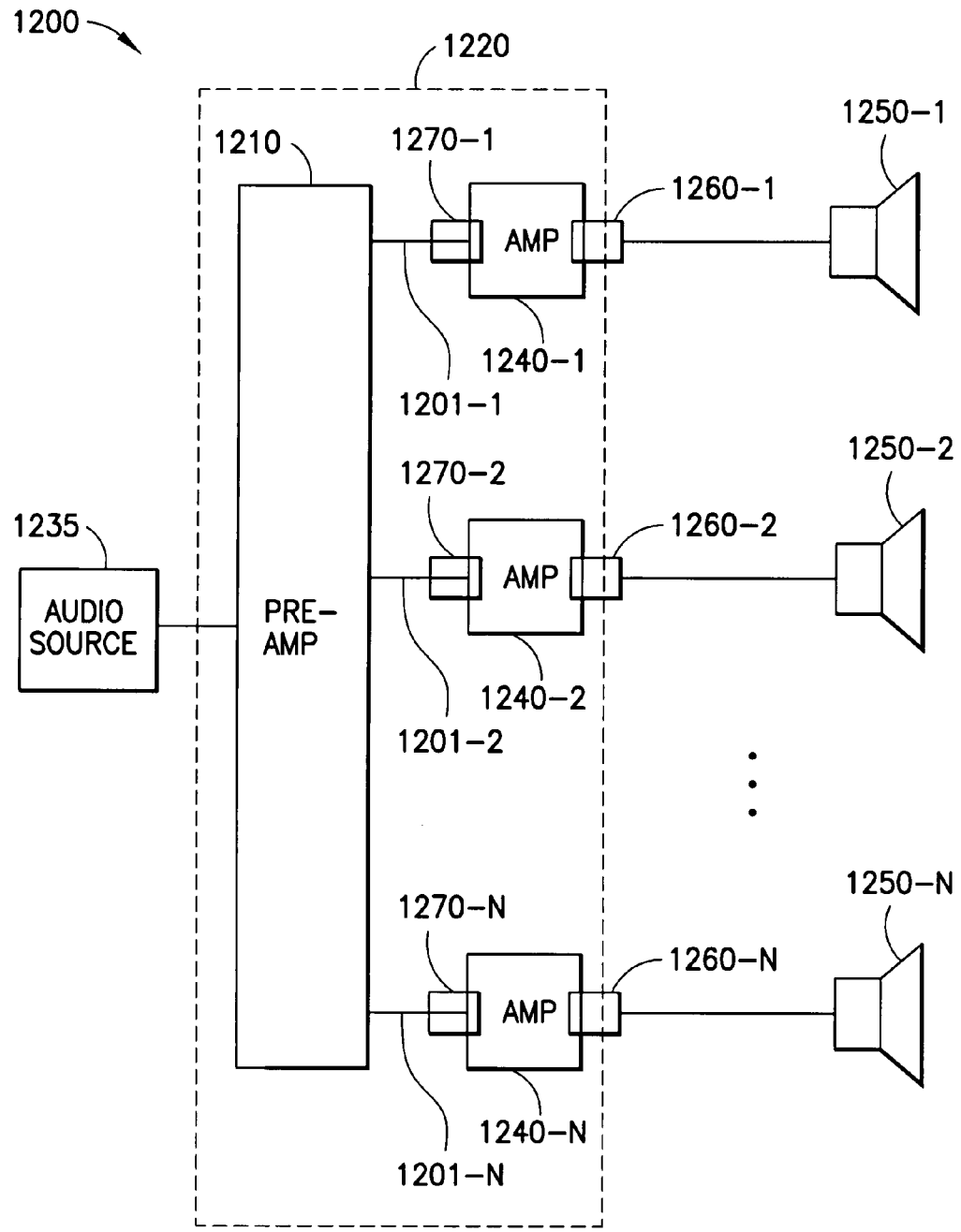
FIG. 12 is a simplified block diagram of an audio system using a number of amplifiers.

For instance, referring now to FIG. 12, a simplified block diagram is shown of an audio system 1200 using a number of amplifiers 1240-1 through 1240-N. In this example, an audio source 1235, such as a device that reads information from a digital versatile disk (DVD), produces analog or digital information that is coupled to the preamplifier 1210. The preamplifier 1210 creates N audio signals 1201-1 through 1201-N from the information. Amplifiers 1240-1 through 1240-N amplify the audio signals 1201 and output amplified audio signals to the speaker wire 1280-1 through 1280-N, which are coupled to the speakers 1250-1 through 1250-N. The amplifiers 1240 can have physical input connections 1270 and output connections 1260, if the amplifiers are distinct entities. Such connections could include RCA jacks, balanced jacks, a SCART connector, or any other type of connector. In another exemplary embodiment, an integrated amplifier 1220 contains both the preamplifier 1210 and amplifiers 1240 and the input connections 1270 are wires internal to the integrated amplifier 1220, while the output connection 1260 is a connection at least partially external to the integrated amplifier 1220.

Figure 13:
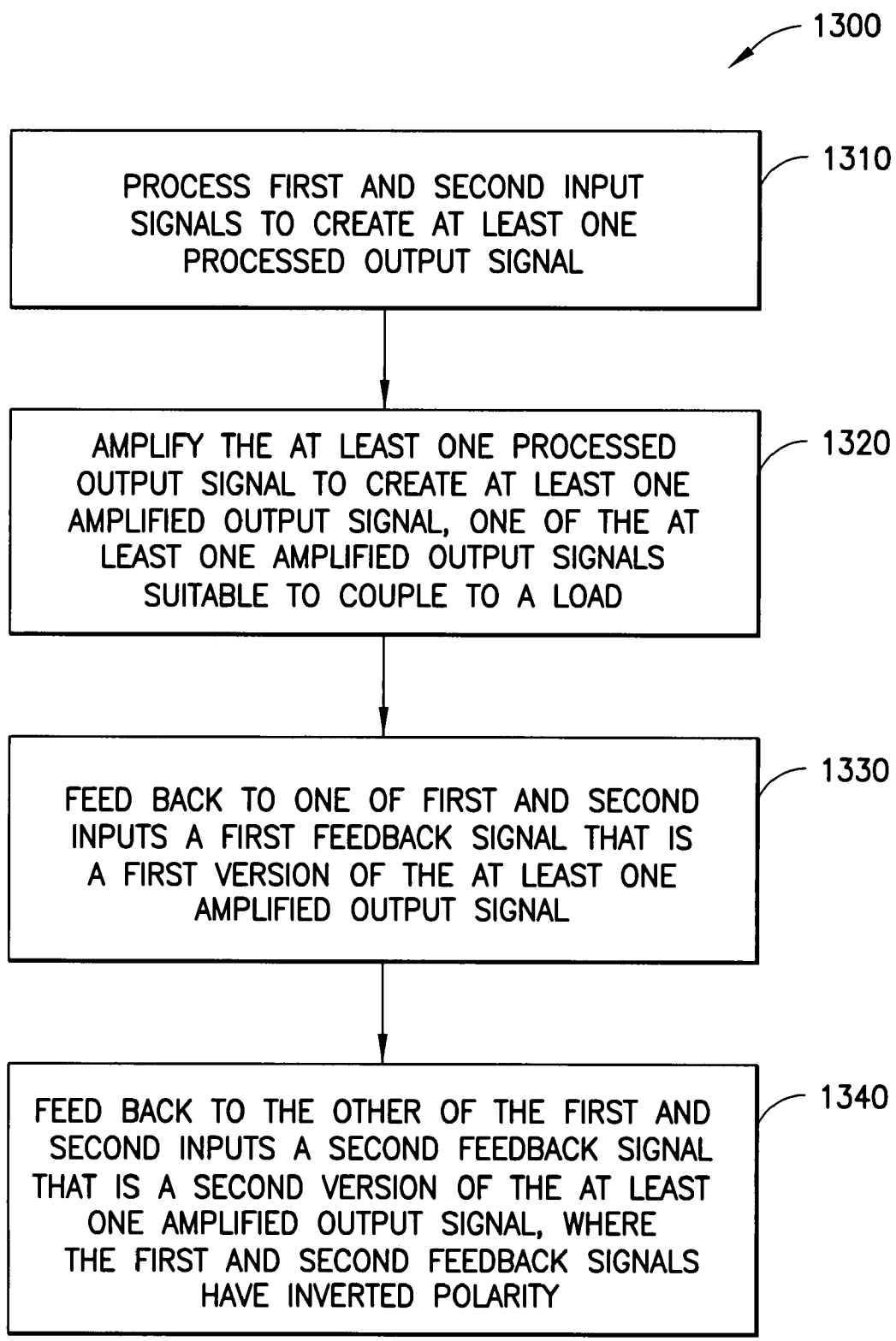
FIG. 13 is a flowchart of an exemplary method for providing differential processing.

Turning to FIG. 13, a flowchart of an exemplary method 1300 is shown for providing differential processing. Method 1300 could be performed, e.g., by a PROG 1115 or by hardware under control of a data processor. Method 1300 includes processing a first input signal on a first input and a second input signal on a second input to create at least one processed output signal (block 1310). In block 1320, the at least one processed output signal is amplified to create at least one amplified output signal, one of the at least one amplified output signals suitable to couple to a load. In block 1330, a first feedback signal is fed back to one of first and second inputs, where the first feedback signal is a first version of the at least one amplified output signal. In block 1340, a second feedback signal is fed back to the other of the first and second inputs, where the second signal is a second version of the at least one amplified output signal, and where the first and second feedback signals have inverted polarity.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the best techniques presently contemplated by the inventors for carrying out embodiments of the invention. However, various modifications and adaptations may become apparent to those skilled in the relevant arts in view of the foregoing description, when read in conjunction with the accompanying drawings and the appended claims. All such and similar modifications of the teachings of this invention will still fall within the scope of this invention.

Furthermore, some of the features of exemplary embodiments of this invention could be used to advantage without the corresponding use of other features. As such, the foregoing description should be considered as merely illustrative of the principles of embodiments of the present invention, and not in limitation thereof. In particular, any of the dependent claims herein can be combined (e.g., as multiple dependent claims).

What is claimed is:

1. An apparatus comprising:
at least one half bridge comprising:
signal processing circuitry including first and second inputs and at least one output;
a driver stage coupled to the at least one output of the signal processing circuitry and configured to create at least one output, one of the at least one outputs of the driver stage suitable to couple to a load;
a first feedback loop coupling the at least one output of the driver stage to a first input of the signal processing stage; and
a second feedback loop coupling the at least one output of the driver stage to a second input of the signal processing stage, where signals on the first and second feedback loops have inverted polarity;
wherein the at least one half bridge further comprises a differential feedback block, wherein the first and second feedback loops pass through the differential feedback block, and wherein the differential feedback block comprises at least one of an analog filter, digital logic, an analog function, or a plurality of inverters configured to cause a delay.

2. The apparatus as in claim 1, wherein the signal processing circuitry includes at least one comparator.

3. The apparatus as in claim 1, wherein the signal processing circuitry includes at least one integrator.

4. The apparatus as in claim 3, wherein the at least one integrator comprises a transconductance amplifier.

5. The apparatus as in claim 1, further comprising a pre-signal-processing stage coupled to inputs of the at least one half bridge and producing outputs coupled to the first and second inputs of the signal processing circuitry.

6. The apparatus as in claim 1, wherein an input signal to the first and second inputs of the signal processing circuitry comprises one of an analog or digital signal.

7. The apparatus as in claim 1, wherein the driver stage includes at least one pre-buffering stage and a power driver stage.

8. The apparatus as in claim 1, wherein a selected one of the first or second feedback loops includes at least one inverter configured to create the inverted polarity, relative to the signal on the other of the first or second feedback loops, of the signal on the selected feedback loop.

9. The apparatus as in claim 1, wherein the at least one half bridge is a single half bridge and wherein the output of the driver stage is suitable for coupling to a first terminal of the load.

10. The apparatus as in claim 1, wherein the at least one half bridge comprises first and second half bridges, wherein the output of the driver stage of the first half bridge is suitable to couple to a first terminal of the load and wherein the output of the driver stage of the second half bridge is suitable to couple to a second terminal of the load.

11. The apparatus as in claim 10, wherein the signal processing circuitry is shared between the first and second half bridges.

12. An apparatus comprising:
at least one half bridge comprising:
signal processing circuitry including first and second inputs and at least one output;
a driver stage coupled to the at least one output of the signal processing circuitry and configured to create at least one output, one of the at least one outputs of the driver stage suitable to couple to a load;
a first feedback loop coupling the at least one output of the driver stage to a first input of the signal processing stage; and
a second feedback loop coupling the at least one output of the driver stage to a second input of the signal processing stage, where signals on the first and second feedback loops have inverted polarity;
wherein one or both of the first and second feedback loops comprise feedback logic including resistors and capacitors.

13. The apparatus as in claim 12, further comprising the load, and wherein the load comprises at least one speaker.

14. The apparatus as in claim 12, further comprising the load and wherein the at least one half bridge is a single half bridge and wherein the one output of the driver stage is suitable for coupling to a first terminal of the load and a second terminal of the load is coupled to ground.

15. The apparatus as in claim 12, wherein the at least one half bridge comprises first and second half bridges, wherein the one output of the driver stage of the first half bridge is suitable to couple to a first terminal of the load and wherein the one output of the driver stage of the second half bridge is suitable to couple to a second terminal of the load.

16. The apparatus as in claim 12, wherein apparatus is disposed in an audio system.

17. The apparatus as in claim 12, wherein the input signal to the first and second inputs of the signal processing circuitry comprises an audio signal.

18. The apparatus as in claim 12, wherein the apparatus is disposed in a portable communication device.

19. An apparatus comprising:
at least one half bridge comprising:
signal processing circuitry including first and second inputs and at least one output:
a driver stage coupled to the at least one output of the signal processing circuitry and configured to create at least one output, one of the at least one outputs of the driver stage suitable to couple to a load;
a first feedback loop coupling the at least one output of the driver stage to a first input of the signal processing stage; and
a second feedback loop coupling the at least one output of the driver stage to a second input of the signal processing stage, where signals on the first and second feedback loops have inverted polarity;
wherein the driver stage comprises first and second amplification stages, wherein the first amplification stage is coupled to a first output of the signal processing circuitry and produces an output forming part of the first feedback loop, and wherein the second amplification stage is coupled to a second output of the signal processing circuitry and produces the output suitable to couple to the load, wherein the output suitable to couple to the load forms part of the second feedback loop.

20. The apparatus as in claim 1, wherein the at least one output of the driver stage is a single output.

21. The apparatus as in claim 1, implemented on at least one integrated circuit.

22. The apparatus as in claim 1, further comprising modulation circuitry coupled to the signal processing circuitry and configured to provide a modulation waveform to the signal processing circuitry.

23. The apparatus as in claim 19, wherein the at least one half bridge comprises first and second half bridges, wherein the one output of the driver stage of the first half bridge is suitable to couple to a first terminal of the load and wherein the one output of the driver stage of the second half bridge is suitable to couple to a second terminal of the load.

24. The apparatus as in claim 23, wherein the signal processing circuitry is shared between the first and second half bridges.

25. An apparatus comprising:
at least one half bridge comprising:
means for signal processing including first and second inputs and at least one output;
means for amplifying coupled to the at least one output of the means for signal processing, the means for amplifying creating at least one output, one of the at least one outputs of the means for amplifying suitable for coupling to a load;
a first feedback means for coupling the at least one output of the means for amplifying to a first input of the means for signal processing; and
a second feedback means for coupling the at least one output of the means for amplifying to a second input of the means for signal processing, where signals on the first and second feedback means have inverted polarity;
wherein one or both of the first and second feedback means comprise feedback logic including resistors and capacitors.

26. The apparatus as in claim 25, wherein the means for signal processing includes at least one comparator means.

27. The apparatus as in claim 25, wherein the means for signal processing includes at least one integrator means.

28. A method comprising:
processing a first input signal on a first input and a second input signal on a second input to create at least one processed output signal;
amplifying the at least one processed output signal to create at least one amplified output signal, one of the at least one amplified output signals suitable to couple to a load;
feeding back to one of first and second inputs a first feedback signal that is a first version of the at least one amplified output signal; and
feeding back to the other of the first and second inputs a second feedback signal that is a second version of the at least one amplified output signal, where the first and second feedback signals have inverted polarity;
wherein the at least one processed signal comprises first and second processed signals, wherein amplifying further comprises amplifying the first processed signal to create an amplified output signal that is suitable for coupling to a first terminal of the load and amplifying the second processed signal to create an amplified signal that is suitable for coupling to a second terminal of the load.

29. The method of claim 28, wherein processing further comprises comparing signals on the first and second inputs and producing at least one comparison signal, and integrating the at least one comparison signal to produce the at least one processed output signal.

* * * * *